United States Patent [19]

Gavish

[11] Patent Number: 4,882,535
[45] Date of Patent: Nov. 21, 1989

[54] DEVICE AND METHOD FOR MONITORING SMALL DESPLACEMENTS OF A PEAK IN A FREQUENCY SPECTRUM

[76] Inventor: Benjamin Gavish, Jerusalem, Israel

[21] Appl. No.: 933,896

[22] Filed: Nov. 24, 1986

[30] Foreign Application Priority Data

Dec. 3, 1985 [IL] Israel .................................. 77207

[51] Int. Cl.⁴ .................... G01R 27/26; G01R 27/02
[52] U.S. Cl. ............................ 324/585 C; 324/57 Q; 324/61 QL
[58] Field of Search ........... 324/61 QS, 61 R, 61 QL, 324/57 Q, 58.5 C, 81, 58 C

[56] References Cited

U.S. PATENT DOCUMENTS

| | | | |
|---|---|---|---|
| 2,733,340 | 1/1956 | Garner et al. | 324/57 Q |
| 2,779,917 | 1/1957 | DeBoisblanc | 324/61 QL |
| 2,982,822 | 5/1961 | Bacon | 324/61 QL |
| 3,071,726 | 1/1963 | Nelson | 325/58 C |
| 3,134,262 | 5/1964 | Dworzan et al. | 324/61 QL |
| 3,231,815 | 1/1966 | Spencer | 324/61 P |
| 3,255,412 | 6/1966 | Liu | 324/61 R |
| 3,315,156 | 4/1967 | Keller | 324/57 Q |
| 3,901,216 | 8/1975 | Felger | 324/61 QL X |
| 4,270,083 | 5/1981 | Fitzky et al. | 324/58.5 C |

OTHER PUBLICATIONS

Anon, Method of and Apparatus for Selectively Measuring the Amount of at Least One Material in a Combination of Two Materials, 1–1975, pp. 35–36.

*Primary Examiner*—Reinhard J. Eisenzopf
*Assistant Examiner*—Jack B. Harvey
*Attorney, Agent, or Firm*—Nixon & Vanderhye

[57] ABSTRACT

An electronic device for monitoring changes in characterizing properties of a tested sample by observing displacements of a selected point on a curve of a frequency spectrum of a tested sample. The device includes a generator for generating at least one continuous wave of a predetermined constant frequency and a constant amplitude, or for generating a continuous wave of a predetermined frequency modulation about a constant frequency and amplitude, a resonator applicable to a tested sample to form a resonating system, the system being connected in circuit to the generator and driven thereby when the continuous wave is passed therethrough, and a circuit for continuously demodulating the output signal of the resonating system to form an amplitude modulated waveform representative, of the instantaneous displacements of the selected point occuring when the continuous wave is passed through the tested sample. The waveform is capable of being displayed for real time monitoring of property changes of the tested sample. A method for monitoring changes in characterising properties of a tested sample is also provided.

12 Claims, 1 Drawing Sheet

DEVICE AND METHOD FOR MONITORING SMALL DESPLACEMENTS OF A PEAK IN A FREQUENCY SPECTRUM

The present invention relates to a device and a method for monitoring small displacements of a peak in a frequency spectrum. More particularly, the present invention is concerned with an electronic device and a method for monitoring changes in characterizing properties of a tested sample by observing displacements of a peak in a frequency spectrum of a tested sample or of a medium.

The term "peak displacement" is meant to refer to a shift in the overall structure of an amplitude vs. frequency characteristic curve having a peak, in terms of its resonance frequency. This curve will be referred to hereinafter as a resonance curve.

Resonance frequency, $f_m$, of a peak in a resonance curve is an informative parameter in various high-precision measurements in science and engineering. Thus, e.g. when using oscillating electric fields, $f_m$ determines the high-frequency dielectric constant of a medium if appropriately placed between the plates of a capacitor, being actively involved in a resonating circuit, and when using ultrasonic resonator, $f_m$ is proportional to the sound velocity of the medium. If, however, the properties of the tested medium fluctuate in time on a time scale which is longer than $1/f_m$, $f_m$ is well defined but becomes time dependent.

Valuable information can be elucidated by monitoring the fluctuations of $f_m$ with respect to some reference value. For example, in quality control of industrial products the homogeniety of a continuously produced medium in terms of keeping its chemical composition of thickness within prescribed limits can be controlled.

The prior art methods of determining fluctuations in resonance frequency share in common the following two main procedures: I—first changing the frequency with time (a frequency sweep) and measuring the resulting amplitude and frequency. The next step can be approached in different ways: (a) in the analog way, a peak detector can "mark" the moment at which the amplitude crosses the maximum; and (b) in the digital way, both amplitude and frequency are recorded digitally and the peak location can then be manipulated. The final output in both ways appears to be a discrete set of $f_m$ values. II—using a positive feedback loop, the amplitude of the resonance frequency $f_m$ is greatly amplified and then mixed with a reference frequency, whereby the difference between the two frequencies can be observed and counted.

The limitations of these known prior art methods are most pronounced when the fluctuations in $f_m$ are small, if compared with the bandwidth and the fast peak displacements of the signal, as well. This is because of the following general reasons as applied to the two procedures.

For the first procedure: (1) $f_m(t)$ can be determined only once during a frequency sweep. A low sweep rates the resolution in time of $f_m(t)$ is relatively poor. At high rates the peak location of the signal is less defined in view of the reduced resolution in time; (2) In some cases, e.g., when using ultrasonic resonator cells, the odutput is blurred at high sweep rates due to the lack of sufficient time for establishing a stable interference pattern; and (3) The need for measuring small fluctuations or displacements in $f_m(t)$, dictates the use of extremely stable frequency generators being capable of performing a frequency sweep with a remarkable reproducibility. These devices are rather expensive.

For the second procedure: (1) The flatness of the resonance curve near the resonance frequency $f_m$ causes the output to be very sensitive to noise; (2) High-precision real-time counting of the differential frequency requires the use of relatively expensive counters, and (3) other features of peak displacement, such as bandwidth of the resonance curve, are even more difficult to monitor by the existing methods.

It is therefore a broad object of the present invention to ameliorate the above-described prior art limitations and to provide a device and method for monitoring small displacements of a peak in a frequency spectrum.

It is a further object of the invention to provide a relatively inexpensive device and method for continuously monitoring small displacements of a peak frequency spectrum of a tested sample or medium.

In accordance with the present invention there is provided an electronic device for monitoring changes in characterizing properties of a tested sample by observing displacements of a selected point on a curve of a frequency spectrum of a tested sample, comprising generator means for generating at least one continuous wave of a predetermined constant frequency and a constant amplitude, or for generating a continuous wave of a predetermined frequency modulation about a constant frequency and amplitude;

resonating means applicable to a tested sample to form a resonating system, said system being connected in circuit to said generator means and driven thereby when said continuous wave is passed therethrough, and circuit means for continuously demodulating the output signal of said resonating system to form an amplitude modulated waveform representative, of the instantaneous displacements of said selected point occurring when said continuous wave is passed through the tested sample, which waveform is capable of being displayed for real time monitoring of property changes of the tested sample.

The invention further provides a method for monitoring changes in characterising properties of a tested sample by observing displacements of a selected point on a curve of a frequency spectrum of a tested sample, comprising the steps of:

(a) generating at least one continuous wave of predetermined constant frequency and a constant amplitude, or for generating a continuous wave of a predetermined frequency modulation about a constant frequency and amplitude, (b) applying said continuous wave to a resonating system comprising a tested sample and passing said wave through said sample;

(c) demoduating the wave passed through the sample to form an amplitude modulated waveform representative of the instantaneous displacements of said selected point occurring when said continuous wave is passed through the tested sample, and (d) feeding said amplitude modulated waveform to means for monitoring the property changes of the tested sample.

With specific reference now to the figures in detail, it is stressed that the particulars shown are by way of example and for purposes of illustrative discussion of the preferred embodiments of the present invention only and are presented in the cause of providing what is believed to be the most useful and readily understood description of the principles of the invention. In this regard, no attempt is made to show structural details of the invention in more detail than is necessary for a fundamental understanding of the invention, the description taken with the drawings making apparent to those skilled in the art how the several forms of the invention may be embodied in practice.

Figure 1:
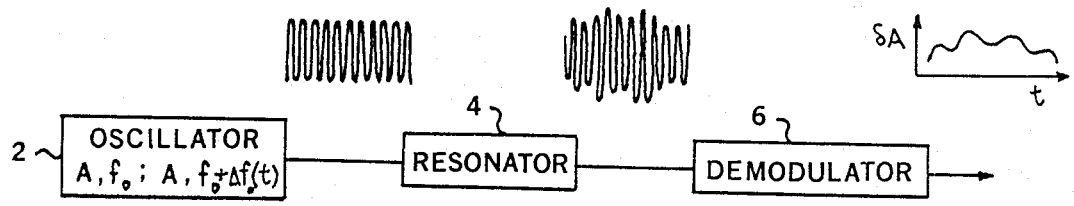
FIG. 1 is a schematic block diagram of a first embodiment of the device according to the invention.

Referring to the device for monitoring small fluctuations or displacements of the peak location of a resonance frequency illustrated in FIG. 1, there are shown an oscillator 2 capable of producing at least one, highly stable, continuous wave of a frequency $f_o$, having a predetermined constant amplitude A, or, alternatively continuous wave of an amplitude A, however, having a frequency modulation $f_o + \Delta f_o(t)$, where $\Delta f_o(t)$ is a predetermined time dependent frequency increment. The output of the oscillator 2 is connected to a resonator 4. The resonator may comprise, e.g., two plates of a capacitor or two crystal bodies between which there is passed or statically placed a sample or medium to be tested or continuously monitored. Alternatively, the resonator may comprise, e.g., a loudspeaker and a microphone set, between which the sample or medium to be tested is placed, or any transducer capable of driving a sample or medium having a natural resonance frequency and providing a measurement of the power absorbed by the resonating sample or medium. The output of the resonator 4 leads to a demodulator 6 which demodulator may be composed of a multiplier, multiplying the output signal of resonator 4 with the constant frequency $f_o$ of the oscillator 2 and a filter for producing an amplitude modulated waveform as will be explained hereinafter. The output from the demodulator 6 may be fed to any monitoring apparatus for displaying and/or processing the waveform obtained at the output of the demodulator.

Figure 2:
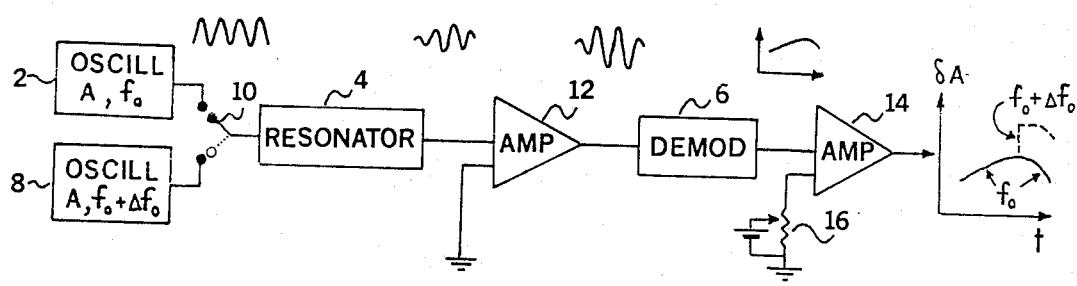
FIG. 2 is a schematic block and circuit diagram of a second embodiment of the device according to the invention.

A slightly modified device according to the invention is shown in FIG. 2. As seen, there are provided two oscillating circuits 2 and 8 for respectively, producing the first wave A, $f_o$ and the second wave $\Delta f$, $F_o + \Delta f_o$, where $\Delta f_o$ is a constant frequency increment, interconnected with the resonator 4 via a switch 10. The output of the resonator 4 is connected to an amplifier 12 leading to a demodulator 6. The output signal from the demodulator is fed to an amplifier 14 together with a DC voltage produced by the adjustable, highly stable voltage source designated as 16.

Instead of the DC voltage source 16, if the desired information includes only an AC signal with specified cutoffs, low and high-pass filters (not shown) can be connected in circuit between the demodulator 6 and the amplifier 14 in order to amplify only selected portions, namely, the ripple of the demodulated signal.

The methods of monitoring small displacements or fluctuations of a peak in a frequency spectrum will now be described with reference also to FIGS. 3 to 5.

Figure 3:
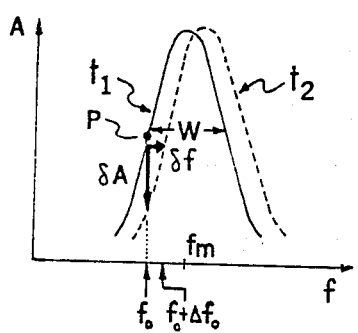
FIG. 3 shows a peak curve of an amplitude A shifted along the frequency axis f by an amount of $\delta f(t)$.

FIG. 3 shows a curve illustrating a peak in a frequency spectrum at a atime $t_l$, centered at a resonance frequency $f_m$, which is shifted uniformly along the frequency axis f by an amount of $\delta f(t)$ to produce the peak curve at time $t_2$. The shift is translated into an amplitude displacement $\delta A$ at a constant frequency $f_o$. For a given frequency $f_o$, $\delta A$ reaches a maximum if $f_o$ is chosen to be at a turning point P of the resonance curve.

For the sake of clarity, the curve shown in FIG. 3 is of a simplified shape having a single maximum at $f_m$ and is shifted uniformly along the frequency axis, i.e., the displacement of each point on the curve is parallel to the frequency axis f and is identical for all points on the curve, namely, the curve is shifted "rigidly" along the frequency axis. It should, however, be understood that the same method is similarly capable of monitoring other types of curve structures and of peak displacements.

It is assumed, for simplicity, that the only type of displacement in time, that affects the frequency spectrum, involves a uniform shift $\delta f(t)$ along the frequency axis f.

Figure 4:
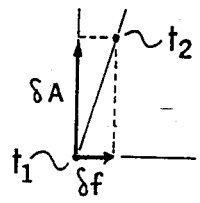
FIG. 4 shows graphically the linear relation between $\delta f(t)$ and $\delta A(t)$.

Upon measuring the amplitude A at a constant frequency $f_o$, its fluctuation $\delta A(t)$ becomes proportional to $\delta f(t)$ for small enough values of $\delta A(t)$ (FIG. 4). Since $\delta f(t)$ is taken to be equal to $\delta f_m(t)$, namely the displacement of $f_m$, $\delta A(t)$ monitors continuously $\delta f_m(t)$, provided that the amplitude of the frequency source is stable enough. For a given $\delta f(t)$, the maximum value of $A(t)$ and the largest region in which the linearity between $\delta f(t)$ and $\delta A(t)$ is preserved, is reached for a frequency $f_o$ which is located near the turning point P of the peak curve.

Returning again to FIG. 2, as can be seen, oscillator 2 produces a continuous wave of a frequency $f_o$ which is fed via the switch 10 to the resonator 4 containing the tested sample or medium. At the output of the resonator there is obtained the carrier wave $f_o$ which is amplitude modulated. This signal is now amplified and demodulated forming a small ripple which is superimposed on a relatively large DC component. Since the useful information is the ripple which illustrates the peak displacement of the wave, the DC component is advantageously removed either by the subtraction of an adjustable level DC voltage or by means of suitable filters and the remaining component is amplified to produce a signal which represents the instantaneous amplitude change of the peak frequency. This signal can be fed to an oscilloscope and/or to any other apparatus capable of producing a graphic display of the signal and thus, the sought after characteristics of the tested medium is continuously monitored. Naturally, this information can be utilized in real time, by suitable installations, to, e.g., correct or rectify any faults or malfunctions during production or the like.

Figure 5:
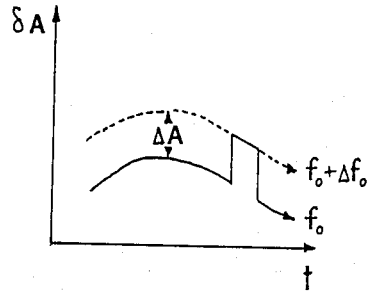
FIG. 5 is a graphic representation illustrating the method of the present invention in producing a frequency scale.

Referring now to FIG. 5 in order to provide a scale for relating amplitude variations $\delta A(t)$ to frequency variations $\delta f(t)$, another continuous wave of a different frequency, $f_o + \Delta f_o$, is produced by the oscillator 8. The wave $f_o + \Delta f_o$ possesses the same amplitude A as the wave $f_o$ and thus if the two oscillators 2 and 8 are selectively connected by means of the switch 10, to the resonator 4, there are alternately displayed, e.g., on an oscilloscope, two substantially parallel curves that correspond to these waves. As explained above, since $\delta A(t)$ is proportional to $\delta f(t)$ $$\delta A(t)/\Delta A = \delta f(t)/\Delta f_o \qquad 5$$

where, $\Delta A$ is the difference between the amplitudes of the frequencies $f_o$ and $f_o + \Delta f_o$ measured at the same instance; and $\Delta f_o$ is chosen in accordance with an estimated range of a frequency shift which may occur in a specific application.

Hence, $\delta f(t) = \delta fm(t) = \delta A(t)(\Delta f_o/\Delta A)$ wherein $\delta A(t)$, $\Delta f_o$ and $\Delta A$ are measurable.

In order to demonstrate the power of the above method in measuring instantaneous small shifts in a peak curve, the following numerical example can be given:

Suppose that $f_o = 1$ MHz, the bandwidth W (see FIG. 3) is 1 KHz and the peak amplitude at $f_o$ is 1 v. The slope at the turning point P is about 1 mv/Hz. Amplitude fluctuations of 0.1 mv, which are easily detectable, are equivalent to $\delta fm = 0.1$ Hz. This value demonstrates that a relative change of the peak of 1 part per $10^7$ is easily detectable by this method. Moreover, this amount of a shift corresponds to a displacement of a peak of 1/10,000 of its bandwidth.

Figure 6:
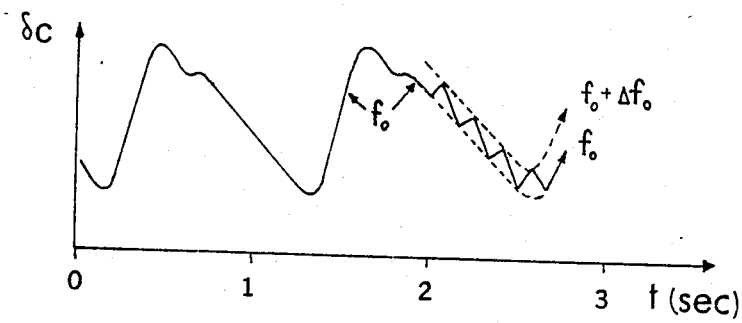
FIG. 6 is a graphic representative illustrating a measurement of a sound velocity in soft tissues.

An actual example of utilization of the present invention sa, e.g., illustrated in FIG. 1 for an, in vivo, measurement of small fluctuations or displacements in the ultrasonic velocity, C, in a living tissue has been conducted as is illustrated in FIG. 6. The ordinate is proportional to the instantaneous value of the fluctuation $\delta C$ measured at frequency $f_o$. $\delta C$ can be shown to be proportional to $\Delta f_m$ and thus also to $\delta A$.

The illustrated pattern represents e.g. "heart beats", which originate from the volume change of the small blood vessels as caused by the pressure pulse. Using a frequency synthesizer, a linear frequency sweep between the two constant frequencies $f_o$, $f_o + \Delta f_o$ is performed 10 times per second, where $\Delta f_o/f_o = 10^{-6}$. Since $C = 1.5 \cdot 10^5$ cm/sec the scale shows a fluctuation of $\delta C$ by 0.15 cm/sec which can be shown to correspond to a change of about 1% in the total volume of small blood vessels.

By using several oscillators of different known frequencies with the same resonator, it is possible to obtain information with regard to real time displacements representing changes in other properties which occur in the monitored sample.

It will be evident to those skilled in the art that the invention is not limited to the details of the foregoing illustrative embodiments and the present invention may be embodied in other specific forms without departing from the spirit or essential attributes thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed is:

1. An electronic device for monitoring changes in characterizing properties of a tested sample by observing displacements of a selected point on a curve of aa frequency spectrum of a tested sample, which displacement results from a movement of all points on a frequency spectrum curve along a frequency axis, comprising generator means for generating two continuous waves each of a predetermined constant frequency and of an identical constant amplitude;

resonating means applicable to a tested sample to form a resonating system, said system being connected in circuit to said generator means and driven thereby when said continuous waves differs from the resonance frequency of said resonating system and being confined to a lower or higher frequency than the resonance frequency, and circuit means for continuously demodulating the output signal of said resonating system to form an amplitude modulated waveform representative, of the instantaneous displacements of said selected point occurring when said continuous wave is passed through the tested sample, which waveform is capable of being displayed for real time monitoring of property changes of the tested sample expressed in terms of frequency shifts.

2. An electronic device for monitoring changes in characterising properties of a tested sample by observing displacements of a selected point on a curve of a frequency spectrum of a tested sample, which displacement results from a movement of all points on a frequency spectrum curve along a frequency axis, comprising generator means for generating a continuous wave of a predetermined frequency modulation about a constant frequency and of a constant amplitude;

resonating means applicable to a tested sample to form a resonating system, said system being connected in circuit to said generator means and driven thereby when said continuous wave is passed therethrough, the frequency of said continuous waves differs from the resonance frequency of said resonating system and being confined to a lower or higher frequency than the resonance frequency, and circuit means for continuously demodulating the output signal of said resonating system to form an amplitude modulated waveform representative, of the instantaneous displacements of said selected point occurring when said continuous wave is passed through the tested sample, which waveform is capable of being displayed for real time monitoring of property changes of the tested sample expressed in terms of a frequency shifts.

3. The device as claimed in claim 1 or 2 wherein said circuit means includes an amplification circuit for amplifying the output signal of said resonating system.

4. The device as claimed in claim 1 or 2 wherein said circuit means comprises an amplifier for forming said amplitude modulated waveform.

5. The device as claimed in claim 1 or 2 further comprising an adjustable DC voltage source connected in circuit at the output of said circuit means for minimizing the DC component of said waveform.

6. The device as claimed in claim 1 or 2 further comprising switching means for selectively applying said waves to said resonating means.

7. A method for monitoring changes in characterising properties of a tested sample by observing displacements of a selected point on a curve of a frequency spectrum of a tested sample, comprising the steps of:

(a) generating at least one continuous wave of a predetermined constant frequency and a constant amplitude,
(b) applying said continuous wave at a non-resonant frequency to a resonating system comprising a tested sample and passing said wave through said sample;
(c) demodulating the wave passed through the sample to form an amplitude modulated waveform representative of the instantaneous displacements of said selected point occurring when said continuous wave is passed through the tested sample, and
(d) feeding said amplitude modulated waveform to means for monitoring the property changes of the tested sample.

8. A method for monitoring changes in characterizing properties of a tested sample by observing displacements of a selected point on a curve of a frequency spectrum of a tested sample, comprising the step of:
(a) generating at least one continuous wave of a predetermined frequency modulation about a constant frequency and a constant amplitude;
(b) applying said continuous wave to a resonating system comprising a tested sample and passing said wave through said sample;
(c) demodulating the wave passed through the sample to form an amplitude modulated waveform representative of the instantaneous displacements of said selected point occurring when said continuous wave is passed through the tested sample; and
(d) feeding said amplitude modulated waveform to means for monitoring the property changes of the tested sample.

9. The method as claimed in claim 7 or 8 further comprising the step of amplifying the wave passed through said sample prior to the demodulation of the same.

10. The method as claimed in claim 7 or 8 further comprising the steps of
generating a continuous second wave of the same predetermined amplitude as the amplitude of said at least one continuous wave but of a different, constant frequency differing from said at least one continuous wave by a predetermined frequency increment, and
selectively applying said at least one or said second wave to said resonating means for forming an output scale display.

11. The method as claimed in claim 7 or 8 wherein said continuous wave and said resonating system are selected so that said constant frequency will prevail within a substantially more linear region of said curve at, or adjacent, a turning point of a resonance curve produced when said continuous wave is applied to said resonator.

12. An electronic device for monitoring changes in properties of a test sample, said device comprising:
resonator means, for electrically resonating at a resonant frequency, said resonant frequency responsive to said monitored changes in said sample, and for providing an electrical output;
generator means for supplying a wave, at a predetermined constant frequency and a constant amplitude, said frequency not equal to said resonant frequency, to said resonator means; and
demodulator means, responsive to said output, for providing an amplitude modulated output representative of variations in said resonant frequency.

* * * * *